(12) United States Patent
Juschicz et al.

(10) Patent No.: US 11,821,921 B2
(45) Date of Patent: Nov. 21, 2023

(54) VOLTAGE SENSOR AND VOLTAGE DIVIDING DEVICE

(71) Applicant: GREENWOOD-POWER GMBH, Rohrau (AT)

(72) Inventors: Norbert Juschicz, Petronell-Carnuntum (AT); Willibald Bacher, Theresienfeld (AT)

(73) Assignee: GREENWOOD-POWER GMBH

(*) Notice: Subject to any disclaimer, the term of this patent is extended or adjusted under 35 U.S.C. 154(b) by 0 days.

(21) Appl. No.: 17/776,918

(22) PCT Filed: Nov. 4, 2020

(86) PCT No.: PCT/EP2020/080971
§ 371 (c)(1),
(2) Date: May 13, 2022

(87) PCT Pub. No.: WO2021/094166
PCT Pub. Date: May 20, 2021

(65) Prior Publication Data
US 2023/0280374 A1 Sep. 7, 2023

(30) Foreign Application Priority Data

Nov. 14, 2019 (AT) .............................. A 50984/2019

(51) Int. Cl.
*G01R 5/04* (2006.01)
*G01R 19/00* (2006.01)
*G01R 15/04* (2006.01)

(52) U.S. Cl.
CPC .......... *G01R 15/04* (2013.01); *G01R 19/0084* (2013.01)

(58) Field of Classification Search
CPC ........ G01R 15/04; G01R 15/06; G01R 15/16; G01R 15/165; G01R 19/0084; H01G 4/005; H01G 4/224; H01G 4/28
(Continued)

(56) References Cited

FOREIGN PATENT DOCUMENTS

| CN | 113451345 A | * | 9/2021 | ................ G01J 1/46 |
| EP | 3211435 A1 | | 8/2017 | |

(Continued)

OTHER PUBLICATIONS

Liu et al.; Translation of CN-113451345-A; Sep. 1, 2021; Translated by Google & EPO (Year: 2021).*

*Primary Examiner* — Alesa Allgood
*Assistant Examiner* — Rahul Maini
(74) *Attorney, Agent, or Firm* — NGUYEN TARBET LLC

(57) ABSTRACT

The invention relates to a voltage sensor with a high-voltage terminal 5, a signal connection and a ground terminal (7), wherein the voltage sensor (1) comprises a core region (2) with an electrical resistor (3) arranged therein and a capacitor arrangement arranged therein, wherein the capacitor arrangement has a first electrode (4), which is connected to the high-voltage terminal (5), a second electrode (6), which is connected to the signal connection, wherein the first electrode (4) and the second electrode (6) are electrically conductively connected via the electrical resistor (3), and wherein the capacitor arrangement has a third electrode (8), which is connected to the ground terminal (7), wherein the first electrode (4), the second electrode (6) and the third electrode (8) each comprise a plurality of electrically conductive, substantially finger-shaped or rod-shaped modulating elements (9, 9', 9") which preferably extend parallel to the longitudinal axis (13) of the voltage sensor.

17 Claims, 2 Drawing Sheets

(58) Field of Classification Search
 USPC .................................................... 324/76.11
 See application file for complete search history.

(56) References Cited

FOREIGN PATENT DOCUMENTS

| EP | 3415928 A1 | 12/2018 |
|----|------------|---------|
| JP | H05142264 A | 6/1993 |
| SU | 1325364 A1 | 7/1987 |
| WO | WO2018114661 A1 | 6/2018 |
| WO | WO2019186607 A1 | 10/2019 |

* cited by examiner

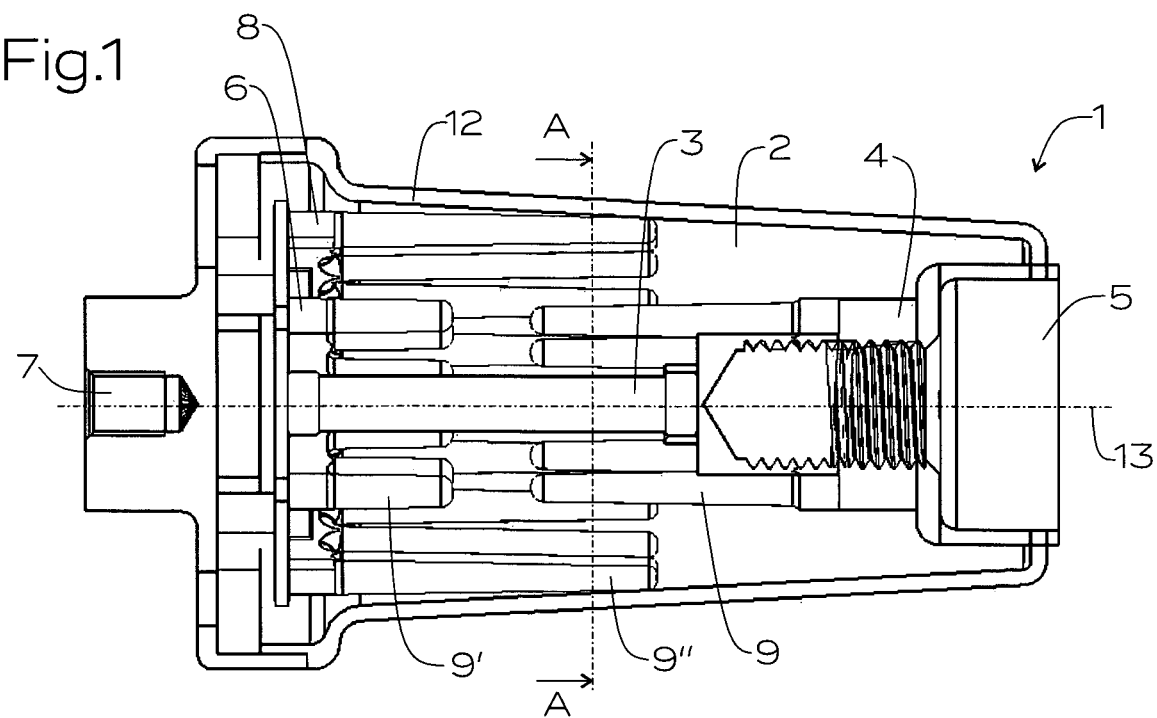
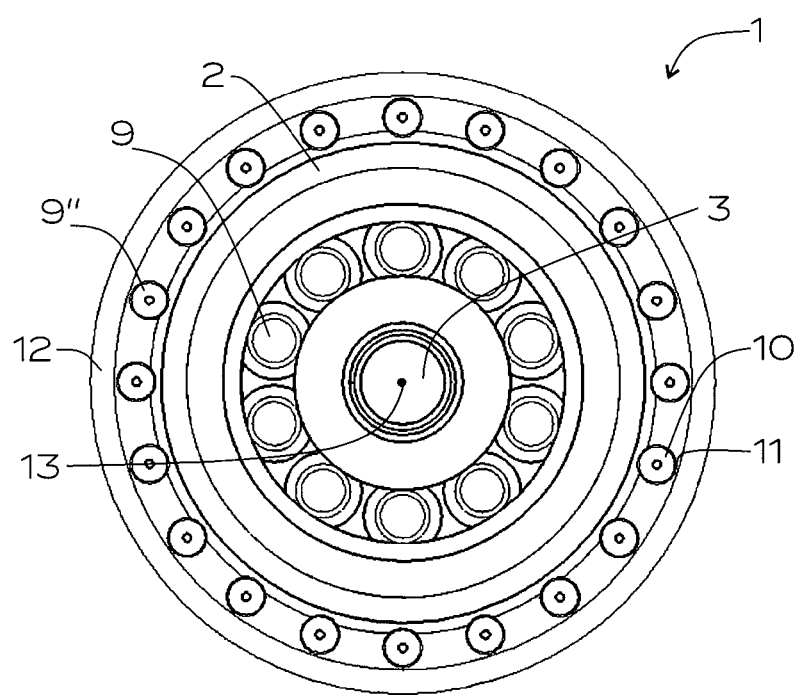

VOLTAGE SENSOR AND VOLTAGE DIVIDING DEVICE

Voltage sensors are used in switchgears of electric grids when measuring the electrical voltage. It is known from the prior art to use a high-impedance resistor as a voltage sensor, and to use this resistor in a resistive voltage divider. These have at least two electrical resistors connected in series, whereby the voltage of the high-voltage primary circuit to be measured is divided according to the ratio of the resistors. However, purely resistive voltage dividers have the disadvantage that stray capacitances and/or parasitic capacitances originating, for example, from the connecting cable or from the other components have a major influence on the actual measured value and thus on the measurement accuracy.

For the measurement of high AC voltages, ohmic capacitive voltage dividers are known, which have at least one electrical resistor in the secondary circuit as a voltage sensor and an electrical capacitor connected in parallel with it with a predefined capacitance. Ohmic capacitive voltage dividers are regularly used in medium-voltage switchgears between 10 kV and 30 kV. They divide the high AC voltage of the primary side into an equivalent lower AC voltage on the secondary side for measurement.

Ohmic capacitive voltage dividers comprise a first resistor-capacitor parallel circuit and, as a voltage sensor, a second resistor-capacitor parallel circuit, with the two resistor-capacitor parallel circuits electrically connected in series. The electrical resistance of the first parallel circuit is much higher than that of the second parallel circuit, so that the voltage drop across the second parallel circuit, the actual voltage sensor, is in a low relation to the high voltage.

A main problem of such ohmic capacitive voltage dividers is that the capacitance of the capacitor arrangement should remain as constant as possible over long periods of time—usually several years or even decades—in order to avoid drifting of the actual measured value. Furthermore, it is necessary to keep the capacitance of the capacitor constant when the outside temperature changes or the frequency of the current changes slightly. In addition, the absorption of moisture into the dielectric located between the capacitor elements may cause a change in capacitance during the life of the voltage divider.

A generic voltage dividing device is shown in EP 3 211 435 A1. Here, the electrodes are cup-shaped. Another voltage dividing device, which however is a purely capacitive device and has only two electrodes, is shown in WO 2019/186607 A1.

It is the object of the present invention to overcome the disadvantages of the prior art and to provide a voltage sensor and a voltage dividing device which has a constant capacitance over a long period of time, in particular over several years or decades, and to maintain the dielectric strength over the entire life of the voltage dividing device.

The object of the invention is solved by the characterizing features of the independent patent claims.

The voltage sensor according to the invention comprises an electrical high-voltage terminal, an electrical signal connection and a ground terminal. The voltage to be measured is applied to the high-voltage terminal during operation. The voltage sensor comprises a core region with an electrical resistor arranged therein and a capacitor arrangement arranged therein. This core region is preferably hermetically sealed and filled with an insulating material.

According to the invention, the capacitor arrangement in the core region comprises a first electrode, which is connected to the high-voltage terminal, and a second electrode, which is connected to the signal connection. The first electrode and the second electrode are spaced apart and electrically connected only through the electrical resistor, forming a resistor-capacitor parallel circuit to form an ohmic capacitive voltage divider.

According to the invention, the capacitor arrangement has a third electrode, which is connected to the ground terminal. The first electrode, the second electrode and the third electrode each comprise a plurality of electrically conductive, substantially finger-shaped or rod-shaped modulating elements. The modulating elements extend parallel to the longitudinal axis of the voltage sensor.

Gas-filled cavities increase the potential of voltage flashovers and prevent complete discharge of the voltage dividing device, which is undesirable for reliable operation. This is particularly important when the capacitor arrangement is embedded in a solid dielectric, respectively when the core region is filled by a solid dielectric. Optionally, a polymer filling the core region may be provided for this purpose.

The finger-shaped or rod-shaped design and the round cross-section respectively the cylindrical shape of the modulating elements reduces the possibility of the formation of detachments and thus the presence of gas-filled cavities, for example due to shrinkage of the dielectric during the manufacturing process of the voltage dividing device.

Further, the rod-shaped modulating elements can more easily adapt to temperature variations, which is not the case with ring-shaped electrode arrangements. The finger-shaped or rod-shaped modulating elements may substantially "travel" with the dielectric medium during the manufacturing process and temperature variations.

Optionally, it is provided that the modulating elements are each arranged in a circular shape. In particular, the modulating elements may be arranged substantially concentrically with respect to one another.

This enables the largest possible capacitor area with a small space requirement. By arranging them in concentric circles, the distance between the capacitor elements may additionally remain constant.

Optionally, the modulating elements of the first electrode and the modulating elements of the second electrode are substantially arranged in the same radius, preferably in a radius of about 8 mm to about 22 mm.

According to the invention, the modulating elements of the third electrode may be arranged in a radius outside the modulating elements of the first and second electrodes, preferably in a radius in the range of about 15 mm to about 40 mm. This has the advantage that the ground potential of the third electrode shields the underlying first and second electrodes from external influences.

The radius of the circular arrangement of the modulating elements of the third electrode may be larger by about 50% than the radius of the circular arrangement of the modulating elements of the first and second electrodes.

The modulating elements may each have a length of about 10 mm to about 60 mm and a diameter of about 1.5 mm to about 10 mm.

When dimensioning the modulating elements, their radial distance may be taken into account. If the distance between the modulating elements is large enough, the risk of voltage flashovers between the modulating elements and any associated damage to the dielectric can be prevented. An adjustment of the distance may be made with respect to the operating conditions, in particular with respect to the input voltage.

According to the invention, it may be provided that the modulating elements of the first electrode and the modulating elements of the second electrode do not have an overlap area along their direction of longitudinal extent. The tips of the modulating elements may be spaced apart by about 3 mm to about 25 mm. Thus, the intended capacitance value between the first electrode and the second electrode can be achieved.

According to the invention, it may be provided that the modulating elements each have a substantially electrically insulating base body and an electrically conductive coating. According to the invention, it may be provided that the modulating elements each comprise an electrically conductive additive and a substantially electrically insulating base compound, the additive preferably comprising or consisting of carbon nanoparticles.

By using an electrically insulating base body respectively by adding an electrically conductive additive to a substantially electrically insulating base compound, the expansion coefficients of the dielectric and the modulating element may be approximated. This further reduces the detachment of the modulating elements and the associated undesired formation of cavities. Preferably, an epoxy resin is used as base body respectively as base compound. In particular in comparison to full-metal modulating elements, the formation of cavities may be greatly reduced in this way.

Optionally, it is provided that the direction of longitudinal extent of the modulating elements run substantially parallel. This way, a substantially continuously constant distance between the modulating elements can be obtained. This may in particular favor a constant capacitance of the capacitor arrangement.

Optionally, it is provided that the modulating elements of the third electrode at least partially, preferably completely, overlap the modulating elements of the first and second electrodes in a direction parallel to their direction of longitudinal extent. The width of the overlap area may improve the shielding of the first and second electrodes against external interference.

Optionally, it is provided that the first electrode and the second electrode each have six to fourteen, preferably eight to twelve, modulating elements. The third electrode generally has a larger circumference and may have 14 to 26, preferably 18 to 22, modulating elements.

Optionally, it is provided that the capacitor arrangement has a capacitance of 0.1 pF to 30 pF, preferably of 0.5 pF to 15 pF, at a temperature of 20° C., a relative humidity of 50%, a pressure of 1,000 mbar and a current frequency of 50 Hz. A sufficiently large capacitance of the capacitor arrangement makes it possible to neglect stray capacitances and parasitic capacitances during voltage measurement. As a result, the residual capacitances mentioned become so small compared to the main capacitance of the capacitor that they no longer have a significant influence on the accuracy of the measurement.

Optionally, it is provided that the core region comprises a dielectric comprising or consisting of a siloxane-based polymer. Siloxane-based polymers, in particular solid siloxane polymers, also known as silicone polymers, have diffusion-inhibiting properties. Such polymers as dielectric are largely insensitive to water vapor diffusion, and no significant changes in dielectric constant are seen when exposed to atmospheric moisture. Further, the frequency transmission behaviour of silicone polymers is better compared to known dielectrics, which means that standard-compliant requirements can be met, in particular with regard to the international standard IEC 61869-11. Additionally, up to 150 kHz can be transmitted within the specified limits.

Siloxane-based polymers, in particular solid siloxane polymers, also known as silicone polymers, have elastic properties. In a voltage sensor according to the invention, the polymer can thus adapt well to the structure of the electrode arrangement. In the case of inelastic materials, for example, cracks can occur in the material in the event of temperature fluctuations, or the material of the capacitor arrangement can at least partially detach from the dielectric.

This can lead to the formation of gas-filled cavities, which on the one hand prevent the capacitance of the capacitor arrangement from remaining constant and on the other hand can lead to voltage flashovers and only incomplete discharge of the voltage sensor. These problems can be avoided with a siloxane-based polymer, since a good connection with the elements of the capacitor arrangement is ensured.

Optionally, it may be provided that the core region is of substantially frustoconical or substantially cylindrical design.

Optionally, it may be provided that a jacket region, preferably a jacket region of epoxy-based polymer, is provided which at least partially, preferably completely, surrounds the core region.

Due to the typical elastic properties of siloxane polymers, it may be advantageous to surround the core region formed from siloxane polymer by a mechanically more stable jacket region and thereby protect it from deformation and destruction.

Optionally, it may be provided that the dielectric of the core region has a relative dielectric constant of 2 to 8. Optionally, it may be provided that the relative dielectric constant of the dielectric of the core region changes by at most 3%, preferably by at most 0.75%, in a temperature range from −40° C. to 80° C. compared with the relative dielectric constant of the dielectric at 20° C.

Since the field of application of the voltage sensor according to the invention is usually in non-air-conditioned or heated areas, it is advantageous if the dielectric constant of the dielectric is as constant as possible in a temperature condition typically occurring under normal environmental conditions. This ensures a uniform capacitance of the capacitor arrangement, which is advantageous for the most accurate voltage measurement possible.

Optionally, it may be provided that the relative dielectric constant of the dielectric of the core region changes by at most 0.6%, preferably by at most 0.4%, in a frequency range from 50 Hz to 150,000 Hz compared to the relative dielectric constant of the dielectric at 50 Hz.

Due to the feeding of different kinds of energy sources, a variation of the network frequency may occur in modern electric grids. Therefore, it is advantageous if the dielectric constant of the dielectric is also constant in a frequency range typical for electric grids to ensure accurate measurement of the voltage.

Optionally, it may be provided that the relative dielectric constant of the dielectric of the core region changes by at most 3%, preferably by at most 2.9%, at a water content of the dielectric of 5‰ to 30‰ compared to the relative dielectric constant of the dielectric at a water content of 30‰.

Since the voltage sensor according to the invention is typically used under normal environmental conditions, it may also be exposed to elevated humidity. Siloxane-based polymers usually have a low water absorption capacity. Nevertheless, it is advantageous if the dielectric constant of the dielectric is as constant as possible over a certain range of water content in order to obtain constant measurement results for the voltage even over long periods of time. In particular, a strong dependence of the dielectric constant on the water content of the dielectric would lead to an undesirable drift of the measured value over time if more and more water diffuses into the dielectric with the operating time of the voltage sensor.

Optionally, it may be provided that the core region is cast from a two-component siloxane system.

Optionally, it may be provided that the maximum water absorption capacity at a temperature of 20° C. is 30% of the inherent weight of the polymer composition. The maximum water absorption capacity may be determined, for example, by storing the silicone polymer for about 1000 days in a climate chamber.

The invention further relates to a voltage dividing device comprising a voltage sensor according to the invention, and to the arrangement of a voltage dividing device according to the invention on a connecting element of a switchgear of an electric grid.

Further features of the invention will be apparent from the patent claims, the exemplary embodiments, and the figures.

In the following, the invention is explained in detail by means of a non-exclusive exemplary embodiment. In the figures:

FIG. 1 shows a lateral sectional view of a voltage sensor according to the invention;

FIG. 2 shows a sectional view of a voltage sensor according to the invention along the axis A-A of FIG. 1;

Figure 3:
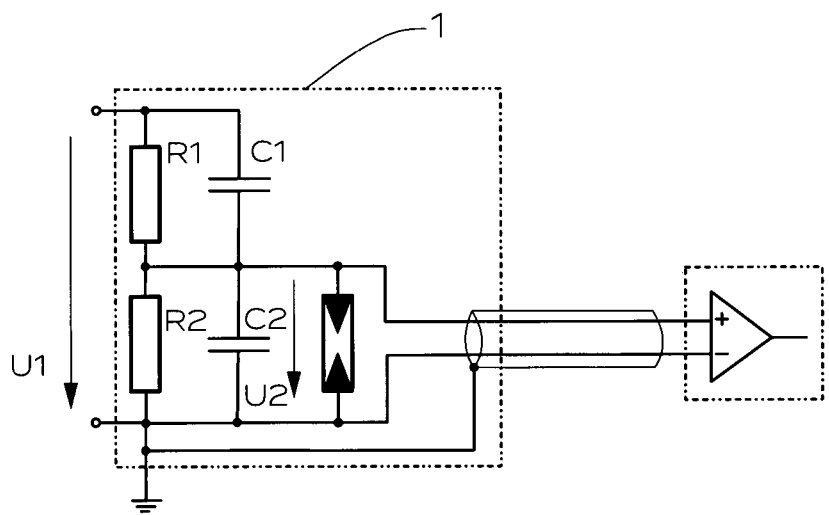
FIG. 3 shows a schematic circuit diagram of a voltage dividing device according to the invention for measuring a high voltage using a voltage sensor according to the invention.

FIG. 1 shows a sectional view of an embodiment of a voltage sensor 1 according to the invention along a plane running through a longitudinal axis 13 of the voltage sensor 1. The voltage sensor 1 is substantially conical and symmetrical to the longitudinal axis 13.

The voltage sensor 1 comprises a core region 2 with a capacitor arrangement, which has a first electrode 4, a second electrode 6 and a third electrode 8. The first electrode 4 and the second electrode 6 are provided at opposite ends of the voltage sensor 1.

The first electrode 4 is connected to a high-voltage terminal 5. In operation, the voltage to be measured is applied to this first electrical terminal 5.

The second electrode 6 is connected to a signal connection, which serves as a measuring line. The second electrode 6 is connected to a ground terminal 7 via a precision resistor R2 not shown and a precision capacitor C2 not shown. The precision resistor and the precision capacitor may be arranged on a circuit board inside the voltage sensor 1.

Between the high-voltage terminal 5 and the signal connection, a high electrical resistor 3 is provided, which extends along the longitudinal axis 13 in the center of the voltage sensor 1. Together with the capacitor arrangement, a resistor-capacitor-combination R1/C1 is formed by the resistor 3, as shown in FIG. 3.

The capacitor arrangement further comprises a third electrode 8, which is connected to the ground terminal 7. The third electrode 8 is arranged outside the first and second electrodes 4, 6 to shield them against disruptive influences from outside the voltage sensor 1.

The first electrode 4, the second electrode 6 and the third electrode 8 each have modulating elements 9, 9', 9" arranged in concentric circles, the modulating elements being of finger-shaped design and extending substantially parallel to the longitudinal axis 13 of the voltage sensor.

The modulating elements 9 of the first electrode 4 and the modulating elements 9' of the second electrode 6 are arranged in a circle in a radius of about 15 mm. The modulating elements 9" of the third electrode 8 are also arranged in a circle and concentrically outside the modulating elements 9, 9' in a radius of about 25 mm.

The modulating elements 9 of the first electrode 4 and the modulating elements 9' of the second electrode 6 project towards each other in opposite directions in the core region 2 and do not have an overlap area along their direction of longitudinal extent. The tips of the modulating elements 9, 9' are spaced apart by about 3 mm. On the other hand, the outermost modulating elements 9" of the third electrode 8 partially overlap the modulating elements 9 of the first electrode 4 in their direction of longitudinal expansion, namely by an overlap area of about 15 mm, and completely overlap the modulating elements 9' of the second electrode 6.

In this exemplary embodiment, the capacitor arrangement and the resistor 3 are surrounded by a core region 2 formed of a siloxane polymer-based elastic material. Since the siloxane polymer in this exemplary embodiment is an elastic soft material, the core region 2 is surrounded by a jacket region 12 formed of an epoxy-based polymer to increase mechanical stability in this exemplary embodiment. The siloxane polymer in this exemplary embodiment exhibits low water diffusion compared to typically used plastic materials, such as epoxy polymers.

FIG. 2 shows a sectional view of the voltage sensor 1 shown in FIG. 1 along axis A-A. FIG. 2 shows the substantially concentric structure of the elements of the voltage sensor 1. The electrical resistor 3 is arranged in the center extending along the central axis 13. The modulating elements 9 of the first electrode 4 and the modulating elements 9' of the second electrode 6 are arranged in an inner circle concentrically to the resistor 3. The modulating elements 9" of the third electrode 8 are arranged concentrically thereto in an outer circle.

In this exemplary embodiment, the modulating elements 9, 9', 9" have a substantially electrically insulating base body 10, which is coated with an electrically conductive coating 11, in particular with a conductive lacquer, in order to be in electrically conductive connection with the first electrode 4, the second electrode 6 and the third electrode 8, respectively.

In other exemplary embodiments, the modulating elements 9, 9', 9" may also be formed entirely of electrically conductive material or of an electrical insulator which is electrically conductive by the addition of additives.

In this exemplary embodiment, the distance between the radii of the two circles describing the arrangement of the modulating elements 9, 9' and 9" is about 7.6 mm. In other exemplary embodiments, however, the distance may also assume other values.

FIG. 3 shows a schematic circuit diagram of a voltage dividing device according to the invention for measuring a high voltage using the voltage sensor 1 of FIGS. 1 and 2. The voltage sensor 1 forms an ohmic capacitive voltage divider consisting of a series connection of the resistor-capacitor parallel circuits with R1 and C1 as well as R2 and C2. Here, the resistor 3 described above forms the resistor R1 and the capacitor arrangement described above forms the capacitor C1. The actual precision resistor R2 and the precision capacitor C2 are located on a circuit board not shown inside the voltage sensor 1. The low voltage U2 is in a known relation to the high voltage U1 to be measured and is transmitted to a measuring amplifier via a ground shielded measuring cable. The measuring cable and the ground terminal 7 of the voltage sensor 1, thus also the modulation elements 9", are grounded.

The voltage sensor 1 described in this exemplary embodiment has a maximum insulation value of 24 kV. However, in other exemplary embodiments, the maximum insulation value may be 52 kV. Any other maximum insulation values are also possible, depending on the field of application.

The voltage sensor 1 according to this exemplary embodiment is designed for a nominal high voltage U1 of maximum 24000/43 V at a frequency of 50 Hz. The secondary voltage U2 in this exemplary embodiment is about 3.25/43 V, but may be adjusted in other exemplary embodiments depending on the application.

In this exemplary embodiment, the response factor of the voltage sensor 1, in particular the capacitance of the capacitor arrangement, is constant in a temperature range from −40° C. to 80° C. In particular, the capacitance of the capacitor arrangement, thus the capacitance C1 in FIG. 3, is about 6 pF in this exemplary embodiment.

The invention is not limited to the illustrated exemplary embodiment, but rather comprises all other voltage sensors and voltage dividers within the scope of the following patent claims.

LIST OF REFERENCE SIGNS

1 Voltage sensor
2 Core region
3 Resistor
4 First electrode
5 High-voltage terminal
6 Second electrode
7 Signal connection
8 Third electrode
9, 9', 9" Modulating element
10 Base body
11 Coating
12 Jacket region
13 Longitudinal axis

The invention claimed is:

1. A voltage sensor (1) with an electrical high-voltage terminal (5), an electrical signal connection and a ground terminal (7), wherein the voltage sensor (1) comprises a core area (2) with an electrical resistor (3) arranged therein and a capacitor arrangement arranged therein, wherein the capacitor arrangement is embedded in a dielectric, and
has a first electrode (4), which is connected to the high-voltage terminal (5),
has a second electrode (6), which is connected to the signal connection,
wherein the first electrode (4) and the second electrode (6) are electrically conductively connected via the electrical resistor (3),
wherein
the capacitor arrangement has a third electrode (8), which is connected to the ground terminal (7),
characterized in that
the first electrode (4), the second electrode (6) and the third electrode (8) each comprise a plurality of electrically conductive, rod-shaped modulating elements (9, 9', 9") with a round cross-section, which extend parallel to the longitudinal axis (13) of the voltage sensor (1).

2. The voltage sensor according to claim 1, characterized in that the modulating elements (9, 9', 9") are arranged in a circle and substantially concentrically to each other.

3. The voltage sensor according to claim 2, characterized in that the modulating elements (9) of the first electrode (4) and the modulating elements (9') of the second electrode (6) are substantially arranged a radius of about 8 mm to about 22 mm.

4. The voltage sensor of claim 1, characterized in that the modulating elements (9, 9', 9") each have a length of about 10 mm to about 60 mm and a diameter of about 1.5 mm to about 10 mm.

5. The voltage sensor of claim 1, characterized in that the modulating elements (9) of the first electrode (4) and the modulating elements (9') of the second electrode (6) do not have an overlap region along their direction of longitudinal extent.

6. The voltage sensor of claim 1, characterized in that the modulating elements (9, 9', 9") each comprise a substantially electrically insulating base body (10) and an electrically conductive coating (11).

7. The voltage sensor of claim 1, characterized in that the modulating elements (9, 9', 9") each comprise an electrically conductive additive and a substantially electrically insulating base compound, the additive comprising or consisting of carbon nanoparticles.

8. The voltage sensor of claim 1, characterized in that the modulating elements (9") of the third electrode (8) at least partially overlap the modulating elements (9, 9') of the first and second electrodes (4, 6) in their direction of longitudinal extent.

9. The voltage sensor of claim 1, characterized in that the first electrode (4) and the second electrode (6) each have six to fourteen modulating elements (9, 9'), and in that the third electrode (8) has 14 to 26 modulation elements (9").

10. The voltage sensor of claim 1, characterized in that the capacitor arrangement has a capacitance of 0.1 pF to 30 pF at a temperature of 20° C., a relative humidity of 50%, a pressure of 1,000 mbar and a current frequency of 50 Hz.

11. The voltage sensor of claim 1, characterized in that the core region (2) comprises a dielectric comprising or consisting of a siloxane-based polymer.

12. A voltage dividing device, comprising a voltage sensor (1) according to claim 1.

13. An arrangement of a voltage dividing device according to claim 12 at a connecting element of a switchgear of an electric grid.

14. The voltage sensor of claim 2, characterized in that the modulating elements (9") of the third electrode (8) are arranged in a radius of about 15 mm to 40 mm outside the modulating elements (9, 9') of the first and second electrodes (4, 6).

15. The voltage sensor according to claim 14, characterized in that the radius of the circular arrangement of the modulating elements (9") of the third electrode (8) is larger by about 50% than the radius of the circular arrangement of the modulating elements (9, 9') of the first and second electrodes (4, 6).

16. The voltage sensor of claim 3, characterized in that the modulating elements (9") of the third electrode (8) are arranged in a radius of about 15 mm to 40 mm outside the modulating elements (9, 9') of the first and second electrodes (4, 6).

17. The voltage sensor according to claim 16, characterized in that the radius of the circular arrangement of the modulating elements (9") of the third electrode (8) is larger by about 50% than the radius of the circular arrangement of the modulating elements (9, 9') of the first and second electrodes (4, 6).

* * * * *